United States Patent
Wang

(10) Patent No.: US 10,049,609 B2
(45) Date of Patent: Aug. 14, 2018

(54) SHIFT REGISTER, GATE DRIVING CIRCUIT, AND DISPLAY DEVICE

(71) Applicants: BOE Technology Group Co., Ltd., Beijing (CN); Hefei Xinsheng Optoelectronics Technology Co., Ltd., Hefei (CN)

(72) Inventor: Fei Wang, Beijing (CN)

(73) Assignees: BOE Technology Group Co., Ltd., Beijing (CN); Hefei Xinsheng Optoelectronics Technology Co., Ltd., Hefei (CN)

( * ) Notice: Subject to any disclaimer, the term of this patent is extended or adjusted under 35 U.S.C. 154(b) by 0 days.

(21) Appl. No.: 15/540,226

(22) PCT Filed: Jul. 26, 2016

(86) PCT No.: PCT/CN2016/091723
§ 371 (c)(1),
(2) Date: Jun. 27, 2017

(87) PCT Pub. No.: WO2017/124721
PCT Pub. Date: Jul. 27, 2017

(65) Prior Publication Data
US 2018/0047327 A1    Feb. 15, 2018

(30) Foreign Application Priority Data
Jan. 19, 2016 (CN) .......................... 2016 1 0034449

(51) Int. Cl.
*G11C 19/00* (2006.01)
*G09G 3/20* (2006.01)
*G11C 19/28* (2006.01)

(52) U.S. Cl.
CPC ......... *G09G 3/2085* (2013.01); *G09G 3/2096* (2013.01); *G11C 19/28* (2013.01);
(Continued)

(58) Field of Classification Search
None
See application file for complete search history.

(56) References Cited

U.S. PATENT DOCUMENTS

2009/0167741 A1  7/2009  Tsai
2010/0182227 A1*  7/2010  Tsou ...................... G11C 19/28
                                                       345/100
(Continued)

FOREIGN PATENT DOCUMENTS

CN    102915698 A    2/2013
CN    103646636 A    3/2014
(Continued)

OTHER PUBLICATIONS

Aug. 28, 2017—(CN) First Office Action 201610034449.9 with Eng Tran.
(Continued)

*Primary Examiner* — Long Nguyen
(74) *Attorney, Agent, or Firm* — Banner & Witcoff, Ltd.

(57) ABSTRACT

A shift register, a gate driving circuit, and a display device, the shit register includes an input module, a first reset module, a first control module, a second control module), a node voltage control module, and an output module. With cooperation of the aforesaid six modules and by setting the node voltage control module to form a bootstrap circuit together with the second control module, the shift register can make a voltage at the second node equal to a voltage of the effective pulse signal at the first clock signal terminal, so that the first control module can operate promptly and effectively under control of the second node.

20 Claims, 8 Drawing Sheets

(52) U.S. Cl.
CPC ............... *G09G 2310/0286* (2013.01); *G09G 2310/0289* (2013.01)

(56) References Cited

U.S. PATENT DOCUMENTS

2014/0240209 A1\* 8/2014 Zhang .................... G11C 19/28
377/64
2016/0125955 A1\* 5/2016 Pang .................... G11C 19/287
377/64

FOREIGN PATENT DOCUMENTS

| | | |
|---|---|---|
| CN | 104282287 A | 1/2015 |
| CN | 104934071 A | 9/2015 |
| CN | 105096902 A | 11/2015 |
| CN | 105118417 A | 12/2015 |
| CN | 105469738 A | 4/2016 |
| TW | 200929131 A | 7/2009 |

OTHER PUBLICATIONS

Oct. 25, 2016—International Search Report and Written Opinion Appn PCT/CN2016/091723 with Eng Tran.

\* cited by examiner

SHIFT REGISTER, GATE DRIVING CIRCUIT, AND DISPLAY DEVICE

The application is a U.S. National Phase Entry of International Application No. PCT/CN2016/091723 filed on Jul. 26, 2016, designating the United States of America and claiming priority to Chinese Patent Application No. 201610034449.9 filed on Jan. 19, 2016.The present application claims priority to and the benefit of the above-identified applications and the above-identified applications are incorporated by reference herein in their entirety.

TECHNICAL FIELD

The present disclosure relates to the field of displaying technology, and more particularly to a shift register, a gate driving circuit, and a display device.

BACKGROUND

With the rapid development of displaying technology, display panels show a development trend towards high integration and low cost more and more. The Gate Driver on Array (GOA) technique integrates Thin Film Transistor (TFT) gate switching circuits on an array substrate of a display panel, thus forming scan driving for the display panel, and accordingly saving the wiring space of a bonding area of a gate Integrated Circuit (IC) and a Fan-out area, which not only can reduce product cost in two aspects of material expenses and manufacturing process, but also can achieve symmetry on two sides of the display panel and a beautiful design of narrow bezel. And such integration technique can also eliminate bonding process in a gate scanning line direction, thus improving the productivity and yield rate.

A typical gate driving circuit comprises a plurality of shift registers in cascaded stages, wherein driving signal output terminals of shift registers in respective stages are connected to corresponding gate lines respectively, so that scan signals can be inputted by shift registers in respective stages to gate lines in respective rows on the display panel in sequence. In the existing shift register, when outputting of the scan signal is completed, usually a signal at a clock signal terminal is supplied to a pull-down node through a switching transistor to charge the pull-down node, so that the pull-down node then controls a switching transistor to discharge a pull-up node. However, in practical operation of the shift register, a voltage at the pull-down node is usually decreased due to a leakage current of other switching transistors connected with the pull-down node, which weakens the discharge capability of the switching transistor that discharges the pull-up node, thereby in turn a relative large noise in the outputted scan signal.

SUMMARY

The embodiments of the present disclosure provide a shift register, a gate driving circuit, and a display device, which can reduce the noise in the outputted scan signal by enhancing the level of a potential at the second node.

Accordingly, an embodiment of the present disclosure provides a shift register, comprising an input module, a first reset module, a first control module, a second control module, a node voltage control module, and an output module, wherein a first terminal of the input module is connected with an input signal terminal, and a second terminal of the input module is connected with a first node; the input module is configured to supply a signal from the input signal terminal to the first node under control of the input signal terminal;

a first terminal of the first reset module is connected with a reset signal terminal, a second terminal of the first reset module is connected with a reference signal terminal, and a third terminal of the first reset module is connected with the first node; the first reset module is configured to supply a signal from the reference signal terminal to the first node under control of the reset signal terminal;

a first terminal of the first control module is connected with the first node, a second terminal of the first control module is connected with a second node, a third terminal of the first control module is connected with a third node, and a fourth terminal of the first control module is connected with the reference signal terminal; the first control module is configured to supply a signal from the reference signal terminal to the second node and the third node under control of the first node, and supply a signal from the reference signal terminal to the first node under control of the second node;

a first terminal of the second control module is connected with a first clock signal terminal, a second terminal of the second control module is connected with a control signal terminal, a third terminal of the second control module is connected with the second node, and a fourth terminal of the second control module is connected with the third node; the second control module is configured to supply a signal from the first clock signal terminal to the third node under control of the first clock signal terminal, and supply a signal from the control signal terminal to the second node under control of the third node;

a first terminal of the node voltage control module is connected with the second node, and a second terminal of the node voltage control module is connected with the third node; the node voltage control module is configured to form a bootstrap circuit together with the second control module, so as to make a voltage at the second node equal to a voltage of an effective pulse signal at the first clock signal terminal under control of the third node;

a first terminal of the output module is connected with a second clock signal terminal, a second terminal of the output module is connected with the reference signal terminal, a third terminal of the output module is connected with the first node, a fourth terminal of the output module is connected with the second node, and a fifth terminal of the output module is connected with a driving signal output terminal of the shift register; the output module is configured to supply a signal from the second clock signal terminal to the driving signal output terminal under control of the first node, supply a signal from the reference signal terminal to the driving signal output terminal under control of the second node, and maintain stability of a voltage difference between the first node and the driving signal output terminal when the first node is in a floating state.

Optionally, in the shift register provided above according to an embodiment of the present disclosure, the node voltage control module specifically comprises a first capacitor;

one terminal of the first capacitor is connected with the second node, and the other terminal of the first capacitor is connected with the third node.

Optionally, in the shift register provided above according to an embodiment of the present disclosure, the input module specifically comprises a first switching transistor;

a gate and a source of the first switching transistor are both connected with the input signal terminal, and a drain of the first switching transistor is connected with the first node.

Optionally, in the shift register provided above according to an embodiment of the present disclosure, the first reset module specifically comprises a second switching transistor;

a gate of the second switching transistor is connected with the reset signal terminal, a source of the second switching transistor is connected with the reference signal terminal, and a drain of the second switching transistor is connected with the first node.

Optionally, in the shift register provided above according to an embodiment of the present disclosure, the first control module specifically comprises a third switching transistor, a fourth switching transistor, and a fifth switching transistor;

a gate of the third switching transistor is connected with the first node, a source of the third switching transistor is connected with the reference signal terminal, and a drain of the third switching transistor is connected with the second node;

a gate of the fourth switching transistor is connected with the first node, a source of the fourth switching transistor is connected with the reference signal terminal, and a drain of the fourth switching transistor is connected with the third node;

a gate of the fifth switching transistor is connected with the second node, a source of the fifth switching transistor is connected with the reference signal terminal, and a drain of the fifth switching transistor is connected with the first node.

Optionally, in the shift register provided above according to an embodiment of the present disclosure, the second control module specifically comprises a sixth switching transistor and a seventh switching transistor;

a gate and a source of the sixth switching transistor are both connected with the first clock signal terminal, and a drain of the sixth switching transistor is connected with the third node;

a gate of the seventh switching transistor is connected with the third node, a source of the seventh switching transistor is connected with the control signal terminal, and a drain of the seventh switching transistor is connected with the second node.

Optionally, in the shift register provided above according to an embodiment of the present disclosure, the output module specifically comprises an eighth switching transistor, a ninth switching transistor, and a second capacitor;

a gate of the eighth switching transistor is connected with the first node, a source of the eighth switching transistor is connected with the second clock signal terminal, and a drain of the eighth switching transistor is connected with the driving signal output terminal;

a gate of the ninth switching transistor is connected with the second node, a source of the ninth switching transistor is connected with the reference signal terminal, and a drain of the ninth switching transistor is connected with the driving signal output terminal;

one terminal of the second capacitor is connected with the first node, and the other terminal of the second capacitor is connected with the driving signal output terminal.

Optionally, the shift register provided above according to an embodiment of the present disclosure further comprises a second reset module;

a first terminal of the second reset module is connected with the reset signal terminal, a second terminal of the second reset module is connected with the reference signal terminal, and a third terminal of the second reset module is connected with the driving signal output terminal; the second reset module is configured to supply a signal from the reference signal terminal to the driving signal output terminal under control of the reset signal terminal.

Optionally, in the shift register provided above according to an embodiment of the present disclosure, the second reset module specifically comprises a tenth switching transistor;

a gate of the tenth switching transistor is connected with the reset signal terminal, a source of the tenth switching transistor is connected with the reference signal terminal, and a drain of the tenth switching transistor is connected with the driving signal output terminal.

Optionally, the shift register provided above according to an embodiment of the present disclosure further comprises a node stabilization module;

a first terminal of the node stabilization module is connected with the input signal terminal, a second terminal of the node stabilization module is connected with the first clock signal terminal, and a third terminal of the node stabilization module is connected with the first node; the node stabilization module is configured to supply a signal from the input signal terminal to the first node under control of the first clock signal terminal.

Optionally, in the shift register provided above according to an embodiment of the present disclosure, the node stabilization module specifically comprises an eleventh switching transistor;

a gate of the eleventh switching transistor is connected with the first clock signal terminal, a source of the eleventh switching transistor is connected with the input signal terminal, and a drain of the eleventh switching transistor is connected with the first node.

Optionally, in the shift register provided above according to an embodiment of the present disclosure, a potential at the control signal terminal is opposite to a potential at the reference signal terminal;

or, the control signal terminal and the first clock signal terminal are connected to a same signal terminal.

Accordingly, an embodiment of the present disclosure further provides a gate driving circuit, comprising a plurality of cascaded stages of the shift register provided above according to an embodiment of the present disclosure, wherein an input signal terminal of the shift register in a first stage is connected with a frame trigger signal terminal;

except the shift register in the first stage, an input signal terminal of the shift register in each of stages is connected with a driving signal output terminal of the shift register in a previous stage;

except the shift register in the last stage, a reset signal terminal of the shift register in each of stages is connected with a driving signal output terminal of the shift register in a next stage.

Accordingly, an embodiment of the present disclosure further provides a display device, comprising the gate driving circuit provided above by the present disclosure.

The shift register, the gate driving circuit, and the display device provided by the embodiment of the present disclosure comprise an input module, a first reset module, a first control module, a second control module, a node voltage control module, and an output module, wherein the input module is configured to supply a signal from the input signal terminal to the first node under control of the input signal terminal; the first reset module is configured to supply a signal from the reference signal terminal to the first node under control of the reset signal terminal; the first control module is configured to supply a signal from the reference signal terminal to the second node and the third node under control of the first node, and supply a signal from the reference signal terminal to the first node under control of the second node; the second control module is configured to supply a signal from the first clock signal terminal to the third node under control of the first clock signal terminal, and supply a signal from the control signal terminal to the second node under control of the third node; the node voltage control module is configured to form a bootstrap circuit together with the second control module, so as to make a voltage at the second node equal to a voltage of an effective pulse signal at the first clock signal terminal under control of the third node; the output module is configured to supply a signal from the second clock signal terminal to the driving signal output terminal under control of the first node, supply a signal from the reference signal terminal to the driving signal output terminal under control of the second node, and maintain stability of a voltage difference between the first node and the driving signal output terminal when the first node is in a floating state. With cooperation of the aforesaid six modules and by setting the node voltage control module to form a bootstrap circuit together with the second control module, the shift register can make a voltage at the second node equal to a voltage of the effective pulse signal at the first clock signal terminal, so that the first control module can operate promptly and effectively under control of the second node, a signal having a potential opposite to a potential of an effective pulse signal from the input signal terminal can be outputted promptly after the driving signal output terminal of the shift register completes the outputting, so as to improve output stability of the shift register, thereby reducing the noise in the scan signal outputted from the driving signal output terminal, and better stabilizing the outputting of the scan signal.

DETAILED DESCRIPTION OF THE EMBODIMENTS

Hereinafter, specific implementations of the shift register, the gate driving circuit, and the display device provided by the embodiments of the present disclosure will be described in detail in combination with the drawings.

Figure 1:
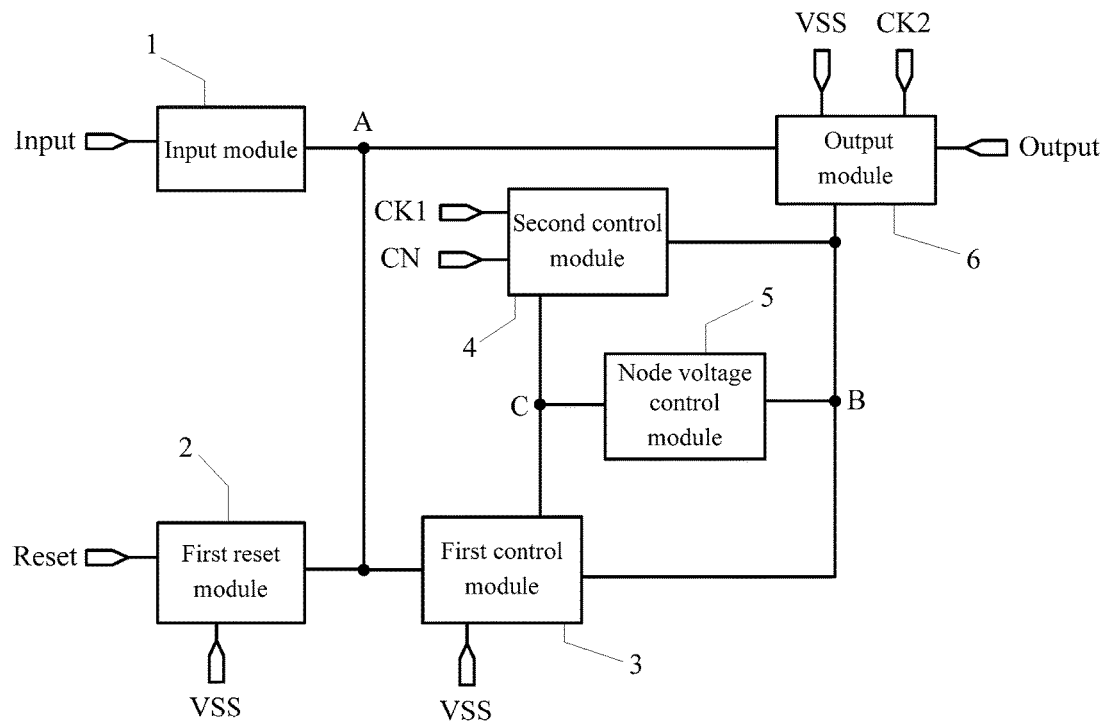
FIG. 1 is a first schematic diagram of structure of the shift register provided according to an embodiment of the present disclosure.

An embodiment of the present disclosure provides a shift register, as illustrated in FIG. 1, the shift register comprises an input module 1, a first reset module 2, a first control module 3, a second control module 4, a node voltage control module 5, and an output module 6, wherein a first terminal of the input module 1 is connected with an input signal terminal Input, and a second terminal of the input module 1 is connected with a first node A; the input module 1 is configured to supply a signal from the input signal terminal Input to the first node A under control of the input signal terminal Input;

a first terminal of the first reset module 2 is connected with a reset signal terminal Reset, a second terminal of the first reset module 2 is connected with a reference signal terminal VSS, and a third terminal of the first reset module 2 is connected with the first node A; the first reset module 2 is configured to supply a signal from the reference signal terminal VSS to the first node A under control of the reset signal terminal Reset;

a first terminal of the first control module 3 is connected with the first node A, a second terminal of the first control module 3 is connected with a second node B, a third terminal of the first control module 3 is connected with a third node C, and a fourth terminal of the first control module 3 is connected with the reference signal terminal VSS; the first control module 3 is configured to supply a signal from the reference signal terminal VSS to the second node B and the third node C respectively under control of the first node A, and supply a signal from the reference signal terminal VSS to the first node A under control of the second node B;

a first terminal of the second control module 4 is connected with a first clock signal terminal CK1, a second terminal of the second control module 4 is connected with a control signal terminal CN, a third terminal of the second control module 4 is connected with the second node B, and a fourth terminal of the second control module 4 is connected with the third node C; the second control module 4 is configured to supply a signal from the first clock signal terminal CK1 to the third node C under control of the first clock signal terminal CK1, and supply a signal from the control signal terminal CN to the second node B under control of the third node C;

a first terminal of the node voltage control module 5 is connected with the second node B, and a second terminal of the node voltage control module 5 is connected with the third node C; the node voltage control module 5 is configured to form a bootstrap circuit together with the second control module 4, so as to make a voltage at the second node B equal to a voltage of an effective pulse signal at the first clock signal terminal CK1 under control of the third node C;

a first terminal of the output module 6 is connected with a second clock signal terminal CK2, a second terminal of the output module 6 is connected with the reference signal terminal VSS, a third terminal of the output module 6 is connected with the first node A, a fourth terminal of the output module 6 is connected with the second node B, and a fifth terminal of the output module 6 is connected with a driving signal output terminal Output of the shift register; the output module 6 is configured to supply a signal from the second clock signal terminal CK2 to the driving signal output terminal Output under control of the first node A, supply a signal from the reference signal terminal VSS to the driving signal output terminal Output under control of the second node B, and maintain the stability of a voltage difference between the first node A and the driving signal output terminal Output when the first node A is in a floating state.

The shift register provided above by the embodiment of the present disclosure includes an input module, a first reset module, a first control module, a second control module, a node voltage control module, and an output module, wherein the input module is configured to supply a signal from the input signal terminal to the first node under control of the input signal terminal; the first reset module is configured to supply a signal from the reference signal terminal to the first node under control of the reset signal terminal; the first control module is configured to supply a signal from the reference signal terminal to the second node and the third node respectively under control of the first node, and supply a signal from the reference signal terminal to the first node under control of the second node; the second control module is configured to supply a signal from the first clock signal terminal to the third node under control of the first clock signal terminal, and supply a signal from the control signal terminal to the second node under control of the third node; the node voltage control module is configured to form a bootstrap circuit together with the second control module, so as to make a voltage at the second node equal to a voltage of an effective pulse signal at the first clock signal terminal under control of the third node; the output module is configured to supply a signal from the second clock signal terminal to the driving signal output terminal under control of the first node, supply a signal from the reference signal terminal to the driving signal output terminal under control of the second node, and maintain stability of a voltage difference between the first node and the driving signal output terminal when the first node is in a floating state. With cooperation of the aforesaid six modules and by setting the node voltage control module so as to form a bootstrap circuit together with the second control module, the shift register can make a voltage at the second node equal to a voltage of the effective pulse signal at the first clock signal terminal, so that the first control module can operate promptly and effectively under control of the second node, and the shift register outputs a scanning signal having a potential opposite to a potential of an effective pulse signal from the input signal terminal promptly after the driving signal output terminal of the shift register completes its outputting, so as to improve output stability of the shift register, thereby reducing the noise in the scan signal outputted from the driving signal output terminal, and better stabilizing the outputting of the scan signal.

It needs to be noted that, in the shift register provided above according to an embodiment of the present disclosure, in a case in which the effective pulse signal at the input signal terminal is at a high potential, the reference signal terminal is at a low potential; alternatively, in a case in which the effective pulse signal at the input signal terminal is at a low potential, the reference signal is at a high potential.

In a specific implementation, in the shift register provided above according to an embodiment of the present disclosure, as illustrated in FIGS. 3a to 4b, the control signal terminal CN and the first clock signal terminal CK1 can be different terminals, in this case, a signal from the control signal terminal CN and a signal from the first clock signal terminal CK1 can have the same cycle and the same phase. Optionally, in a specific implementation, in order to reduce the number of signal lines, in the shift register provided above according to an embodiment of the present disclosure, as illustrated in FIGS. 5a to 6b, the control signal terminal and the first clock signal terminal CK1 can be one signal terminal.

In a specific implementation, since the first clock signal terminal is connected with the output module in the shift register in a next stage, the load for the first clock signal terminal is relative large, and there is a frequent high-low potential conversion, interference may occur in a level of a potential at the second node when an effective pulse signal from the first clock signal terminal is supplied to the second node; therefore, optionally, in the shift register provided above according to an embodiment of the present disclosure, a potential at the control signal terminal is opposite to a potential at the reference signal terminal. Specifically, in a case in which the effective pulse signal from the input signal terminal is at a high potential, the control signal terminal is at a high potential; alternatively, in a case in which an effective pulse signal from the input signal terminal is at a low potential, the control signal terminal is at a low level. In this way, a constant-voltage signal from the control signal terminal is inputted to the second node, interference due to the high-low potential conversion of a clock signal on the second node can be avoided, so that stability of the potential at the second node can be improved.

Next, the present disclosure will be described in detail in combination with the specific embodiments. It needs to be noted that, the embodiments are to describe the present disclosure better, not intended to limit the present disclosure.

Specifically, in a specific implementation, in the shift register provided above according to an embodiment of the present disclosure, as illustrated in FIGS. 3a to 6b, the input module 1 can specifically comprise a first switching transistor Ml;

a gate and a source of the first switching transistor M1 are both connected with the input signal terminal Input, and a drain of the first switching transistor M1 is connected with the first node A.

In a specific implementation, in the shift register provided above according to an embodiment of the present disclosure, in a case where an effective pulse signal from the input signal terminal Input is at a high potential, as illustrated in FIGS. 3a, 3b, 5a, and 5b, the first switching transistor M1 can be a P-type transistor; alternatively, in a case where an effective pulse signal from the input signal terminal Input is at a low potential, as illustrated in FIGS. 4a, 4b, 6a, and 6b, the first switching transistor M1 can be an N-type transistor, no limitations are made here.

In a specific implementation, in the shift register provided above according to an embodiment of the present disclosure, when the first switching transistor is in a turned-on state under control of the input signal terminal, a signal from the input signal terminal Input is supplied to the first node.

The above merely illustrates specific structure of the input module in the shift register by examples, in a specific implementation, structure of the input module is not limited to the aforesaid structure provided by the embodiment of the present disclosure, it can be other structures known to those skilled in the art, no limitations are made here.

Since a source and a drain of the transistors adopted here are symmetrical, the source and the drain of these transistors can be interchanged. In the embodiments of the present disclosure, in order to distinguish the two electrodes other than the gate, one electrode is referred to as a source, and the other electrode is referred to as a drain. If a source is selected as a signal input terminal, then a drain serves as a signal output terminal, and vice versa.

Specifically, in a specific implementation, in the shift register provided above according to an embodiment of the present disclosure, as illustrated in FIGS. 3a to 6b, the first reset module 2 can specifically comprise a second switching transistor M2;

a gate of the second switching transistor M2 is connected with the reset signal terminal Reset, a source of the second switching transistor M2 is connected with the reference signal terminal VSS, and a drain of the second switching transistor M2 is connected with the first node A.

In a specific implementation, in the shift register provided above according to an embodiment of the present disclosure, as illustrated in FIGS. 3a to 6b, the second switching transistor M2 can be an N-type switching transistor or a P-type switching transistor, no limitations are made here. As illustrated in FIGS. 3a, 3b, 5a, and 5b, in a case where the second switching transistor M2 is an N-type switching transistor, when the reset signal terminal Reset is at a high potential, the second switching transistor M2 is in a turned-on state and a signal from the reference signal terminal VSS is supplied to the first node A. As illustrated in FIGS. 4a, 4b, 6a, and 6b, in a case where the second switching transistor M2 is a P-type switching transistor, when the reset signal terminal is at a low potential, the second switching transistor M2 is in a turned-on state and a signal from the reference signal terminal VSS is supplied to the first node A.

The above merely illustrates specific structure of the first reset module in the shift register by examples, in a specific implementation, structure of the first reset module is not limited to the aforesaid structure provided by the embodiment of the present disclosure, it can be other structures known to those skilled in the art, no limitations are made here.

Specifically, in a specific implementation, in the shift register provided above according to an embodiment of the present disclosure, as illustrated in FIGS. 3a to 6b, the first control module 3 can specifically comprise a third switching transistor M3, a fourth switching transistor M4, and a fifth switching transistor M5;

a gate of the third switching transistor M3 is connected with the first node A, a source of the third switching transistor M3 is connected with the reference signal terminal VSS, and a drain of the third switching transistor M3 is connected with the second node B;

a gate of the fourth switching transistor M4 is connected with the first node A, a source of the fourth switching transistor M4 is connected with the reference signal terminal VSS, and a drain of the fourth switching transistor M4 is connected with the third node C;

a gate of the fifth switching transistor M5 is connected with the second node B, a source of the fifth switching transistor M5 is connected with the reference signal terminal VSS, and a drain of the fifth switching transistor M5 is connected with the first node A.

In a specific implementation, in the shift register provided above according to an embodiment of the present disclosure, in a case in which an effective pulse signal from the input signal terminal Input is at a high potential, as illustrated in FIGS. 3a, 3b, 5a, and 5b, the third switching transistor M3, the fourth switching transistor M4, and the fifth switching transistor M5 can be an N-type switching transistor each; alternatively, in a case in which an effective pulse signal from the input signal terminal Input is at a low potential, as illustrated in FIGS. 4a, 4b, 6a, and 6b, the third switching transistor M3, the fourth switching transistor M4, and the fifth switching transistor M5 can be a P-type switching transistor each, no limitations are made here.

In a specific implementation, in the shift register provided above according to an embodiment of the present disclosure, when the third switching transistor is in a turned-on state under control of the first node, a signal from the reference signal terminal is supplied to the second node; when the fourth switching transistor is in a turned-on state under control of the first node, a signal from the reference signal terminal is supplied to the third node; when the fifth switching transistor is in a turned-on state under control of the second node, a signal from the reference signal terminal is supplied to the first node.

The above merely illustrates specific structure of the first control module in the shift register by examples, in a specific implementation, structure of the first control module is not limited to the aforesaid structure provided by the embodiment of the present disclosure, it can be other structures known to those skilled in the art, no limitations are made here.

Specifically, in a specific implementation, in the shift register provided above according to an embodiment of the present disclosure, as illustrated in FIGS. 3a to 6b, the second control module 4 can specifically comprise a sixth switching transistor M6 and a seventh switching transistor M7;

a gate and a source of the sixth switching transistor M6 are both connected with the first clock signal terminal CK1, and a drain of the sixth switching transistor M6 is connected with the third node C;

a gate of the seventh switching transistor M7 is connected with the third node C, a source of the seventh switching transistor M7 is connected with the control signal terminal CN, and a drain of the seventh switching transistor M7 is connected with the second node B.

In a specific implementation, in the shift register provided above according to an embodiment of the present disclosure, in a case in which an effective pulse signal from the first clock signal terminal CK1 is at a high potential, as illustrated in FIGS. 3a, 3b, 5a, and 5b, the sixth switching transistor M6 and the seventh switching transistor M7 can be an N-type switching transistor each; alternatively, in a case in which an effective pulse signal from the first clock signal terminal CK1 at a low potential, as illustrated in FIGS. 4a, 4b, 6a, and 6b, the third switching transistor M3, the sixth switching transistor M6, and the seventh switching transistor M7 can be a P-type switching transistor each, no limitations are made here.

In a specific implementation, in the shift register provided above according to an embodiment of the present disclosure, when the sixth switching transistor is in a turned-on state under control of the first clock signal terminal, a signal from the first clock signal terminal is supplied to the third node; when the seventh switching transistor is in a turned-on state under control of the third node, a signal from the control signal terminal is supplied to the second node.

The above merely illustrates specific structure of the second control module in the shift register by examples, in a specific implementation, structure of the second control module is not limited to the aforesaid structure provided by the embodiment of the present disclosure, it can be other structures known to those skilled in the art, no limitations are made here.

In a specific implementation, in the shift register provided above according to an embodiment of the present disclosure, generally, a size of the fourth switching transistor is designed larger than that of the sixth switching transistor at the time of manufacturing, so that when there is an effective pulse signal at the input signal terminal, a rate at which the fourth switching transistor supplies a signal from the reference signal terminal to the third node under control of the first node is greater than a rate at which the sixth switching transistor supplies a first clock signal to the third node under control of the first clock signal terminal, thus ensuring that the seventh switching transistor is in a turned-off state, thereby ensuring that the potential at the second node is in an inactive potential state.

Specifically, in a specific implementation, in the shift register provided above according to an embodiment of the present disclosure, as illustrated in FIGS. 3a to 6b, the output module 6 can specifically comprise an eighth switching transistor M8, a ninth switching transistor M9, and a second capacitor C2;

a gate of the eighth switching transistor M8 is connected with the first node A, a source of the eighth switching transistor M8 is connected with the second clock signal terminal CK2, and a drain of the eighth switching transistor M8 is connected with the driving signal output terminal Output;

a gate of the ninth switching transistor M9 is connected with the second node B, a source of the ninth switching transistor M9 is connected with the reference signal terminal VSS, and a drain of the ninth switching transistor M9 is connected with the driving signal output terminal Output;

one terminal of the second capacitor C2 is connected with the first node A, and the other terminal of the second capacitor C2 is connected with the driving signal output terminal Output.

In a specific implementation, in the shift register provided above according to an embodiment of the present disclosure, in a case in which an effective pulse signal from the input signal terminal Input is at a high potential, as illustrated in FIGS. 3a, 3b, 5a, and 5b, the eighth switching transistor M8 and the ninth switching transistor M9 can be an N-type switching transistor each; alternatively, in a case in which an effective pulse signal from the input signal terminal Input is at a low potential, as illustrated in FIGS. 4a, 4b, 6a, and 6b, the eighth switching transistor M8 and the ninth switching transistor M9 can be a P-type switching transistor each, no limitations are made here.

In a specific implementation, in the shift register provided above according to an embodiment of the present disclosure, when the eighth switching transistor is in a turned-on state under control of the first node, a signal from the second clock signal terminal is supplied to the driving signal output terminal; when the ninth switching transistor is in a turned-on state under control of the second node, a signal from the reference signal terminal is supplied to the driving signal output terminal; and when the first node is in a floating state, the stability of a voltage difference between two terminals of the second capacitor can be maintained due to the bootstrap effect of the second capacitor, that is, a voltage difference between the first node and the driving signal output terminal is maintained stable.

The above merely illustrates specific structure of the output module in the shift register by examples, in a specific implementation, structure of the output module is not limited to the aforesaid structure provided by the embodiment of the present disclosure, it can be other structures known to those skilled in the art, no limitations are made here.

Specifically, in a specific implementation, in the shift register provided above according to an embodiment of the present disclosure, as illustrated in FIGS. 3a to 6b, the node voltage control module 5 can specifically comprise a first capacitor C1;

one terminal of the first capacitor C1 is connected with the second node B, and the other terminal of the first capacitor C1 is connected with the third node C.

In the existing shift register, usually, after outputting the scan signal, when the sixth switching transistor is turned on under control of the first clock signal terminal and a signal from the first clock signal terminal is supplied to the third node, and the seventh switching transistor is turned on under control of the third node and a signal from the control signal terminal is supplied to the second node; then the second node controls the fifth switching transistor to be turned on so as to supply a signal from the reference signal terminal to the first node, thus ensuring the turn-off of the third switching transistor and the fourth switching transistor under control of the first node. However, in practice, after outputting of the scan signal, the first node can enable the third switching transistor to be turned on under the effect of the second capacitor so as to supply a signal from the reference signal terminal to the second node, and enable the fourth switching transistor to be turned on so as to supply a signal from the reference signal terminal to the third node; and in turn, when the sixth switching transistor is turned on under control of the first clock signal terminal and a signal from the first clock signal terminal is supplied to the third node, a voltage at the third node is lower than an expected value; when the seventh switching transistor is turned on under control of the third node that is not fully charged and a signal from the control signal terminal is supplied to the second node, a voltage at the second node is lower than an expected value; therefore, when the fifth switching transistor supplies a signal from the reference signal terminal to the first node under control of the second node that is not fully charged, it is difficult to discharge the first node promptly, and in turn, it is difficult to control the third switching transistor and the fourth switching transistor to be turned off promptly.

For example, in a specific implementation, when the potential of the effective pulse signal at the input signal terminal is at a high potential, the high potential of a signal at the first clock signal terminal is usually at 22V; when this signal is supplied to the second node, although the second node is also in a high potential state at this moment, the actual voltage at the second node can be only 14V, which weakens the capability of the fifth switching transistor for discharging the first node and weakens the capability of the ninth switching transistor for discharging the driving signal output terminal; only after a certain period of time, a voltage of the second node in a high potential state can reach 22V, and then the shift register can operate normally.

In the shift register provided above according to an embodiment of the present application, since the first capacitor in the node voltage control module can form a bootstrap circuit together with the sixth switching transistor and the seventh switching transistor in the second control module, when the sixth switching transistor is turned on under control of the first clock signal terminal and a signal from the first clock signal terminal is supplied to the third node, and the seventh switching transistor is turned on under control of the third node and a signal from the control signal terminal is supplied to the second node, it is assumed that the voltage at the second node is a first voltage at this moment, a voltage at the third node can be written to the second node due to the effect of the first capacitor, so that the voltage at the second node is equal to a sum of the voltage at the third node and the voltage at the first node, thereby making the voltage at the second node be identical to the voltage of the effective pulse signal at the first clock signal terminal. Therefore, the fifth switching transistor can be turned on promptly under control of the second node which is fully charged and a voltage at the reference signal terminal is supplied to the first node, thus making the voltage at the first node be in an inactive state promptly; and in turn, the third switching transistor and the fourth switching transistor can be turned off promptly. For example, when a signal having a voltage of 22V at a high potential from the first clock signal terminal is supplied to the third node, since the first capacitor can form a bootstrap circuit together with the sixth switching transistor and the seventh switching transistor, the voltage of the second node at a high potential is changed to be 22V immediately; in comparison to the case in which the voltage of the second node being at a high potential is only 14V at the beginning and then is increased to 22V after a certain period of time, a speed at which the voltage of the second node being at a high potential is changed to 22V can be accelerated, thus enhancing the discharge capability of the shift register after the scan signal is outputted.

The above merely illustrates specific structure of the node voltage control module in the shift register by examples, in a specific implementation, structure of the output module is not limited to the aforesaid structure provided by the embodiment of the present disclosure, it can be other structures known to those skilled in the art, no limitations are made here.

Figure 2:
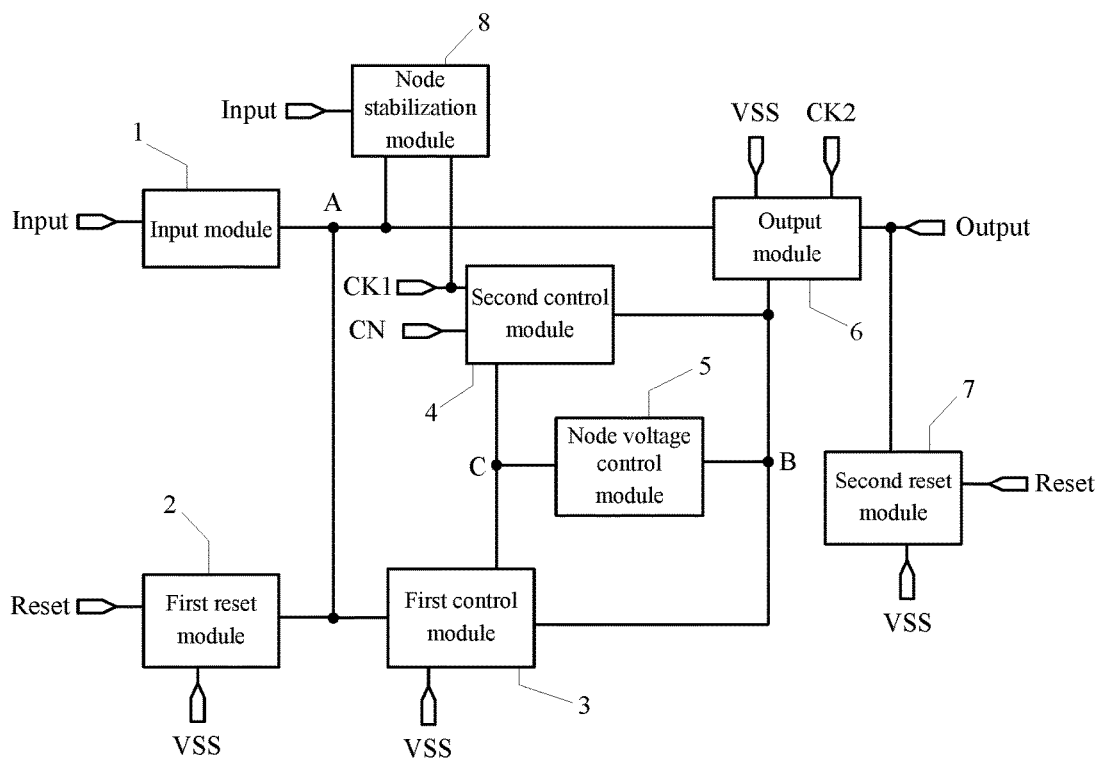
FIG. 2 is a second schematic diagram of structure of the shift register provided according to an embodiment of the present disclosure.

Further, in a specific implementation, when outputting of the driving signal output terminal Output is completed, in order to further ensure that the driving signal output terminal Output can output a scan signal having a potential opposite to the potential of an effective pulse signal at the input signal terminal Input, the shift register provided above according to an embodiment of the present disclosure, as illustrated in FIG. 2, can further comprise a second reset module 7; wherein a first terminal of the second reset module 7 is connected with the reset signal terminal Reset, a second terminal of the second reset module 7 is connected with the reference signal terminal VSS, and a third terminal of the second reset module 7 is connected with the driving signal output terminal Output; the second reset module 7 is configured to supply a signal from the reference signal terminal to the driving signal output terminal Output under control of the reset signal terminal Reset.

Specifically, in a specific implementation, in the shift register provided above according to an embodiment of the present disclosure, as illustrated in FIGS. 3b, 4b, 5b, and 6b, the second reset module 7 can specifically comprise a tenth switching transistor M10; wherein a gate of the tenth switching transistor M10 is connected with the reset signal terminal Reset, a source of the tenth switching transistor M10 is connected with the reference signal terminal VSS, and a drain of the tenth switching transistor M10 is connected with the driving signal output terminal Output.

Figure 3A:
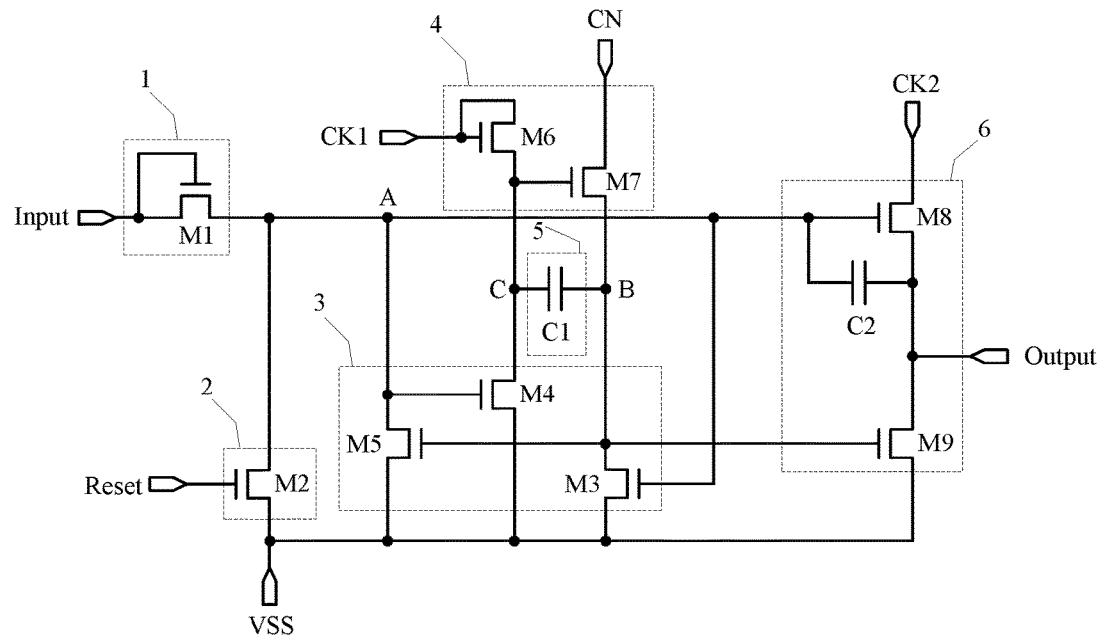
FIG. 3a is a first schematic diagram of specific structure of the shift register illustrated in FIG. 1.
Figure 3B:
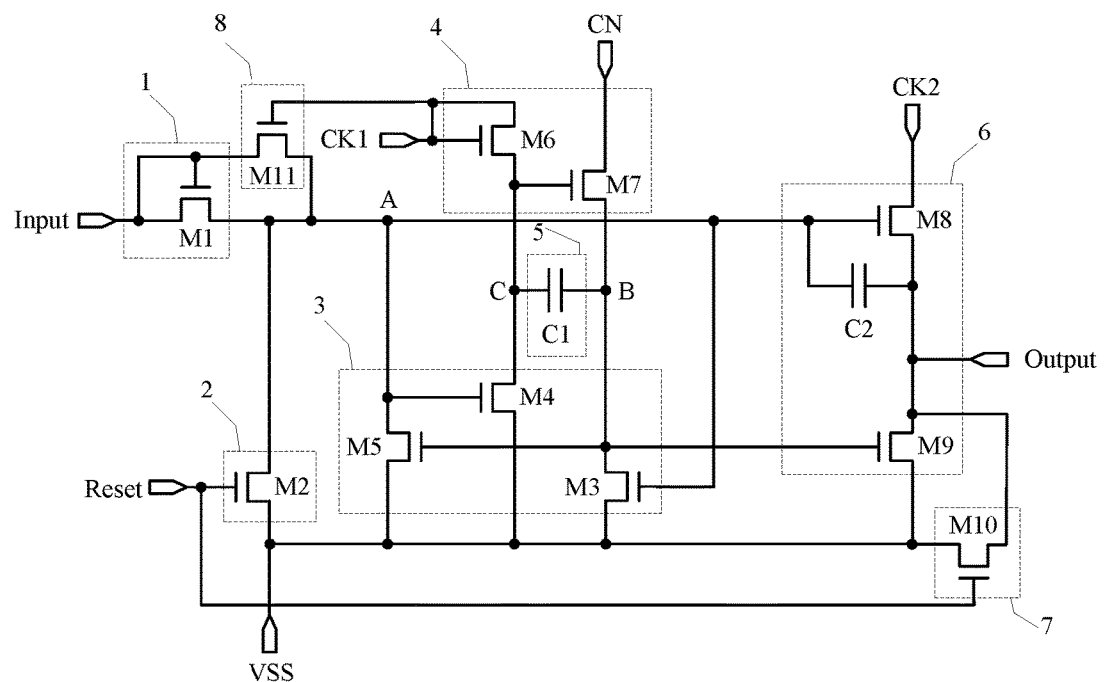
FIG. 3b is a first schematic diagram of specific structure of the shift register illustrated in FIG. 2.
Figure 4A:
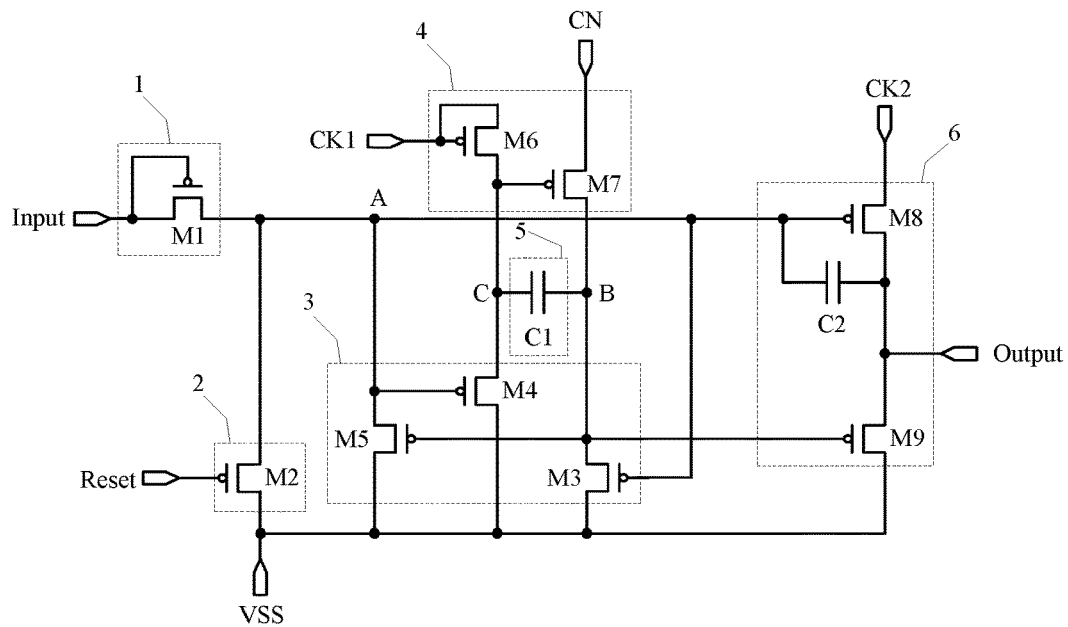
FIG. 4a is a second schematic diagram of specific structure of the shift register illustrated in FIG. 1.
Figure 4B:
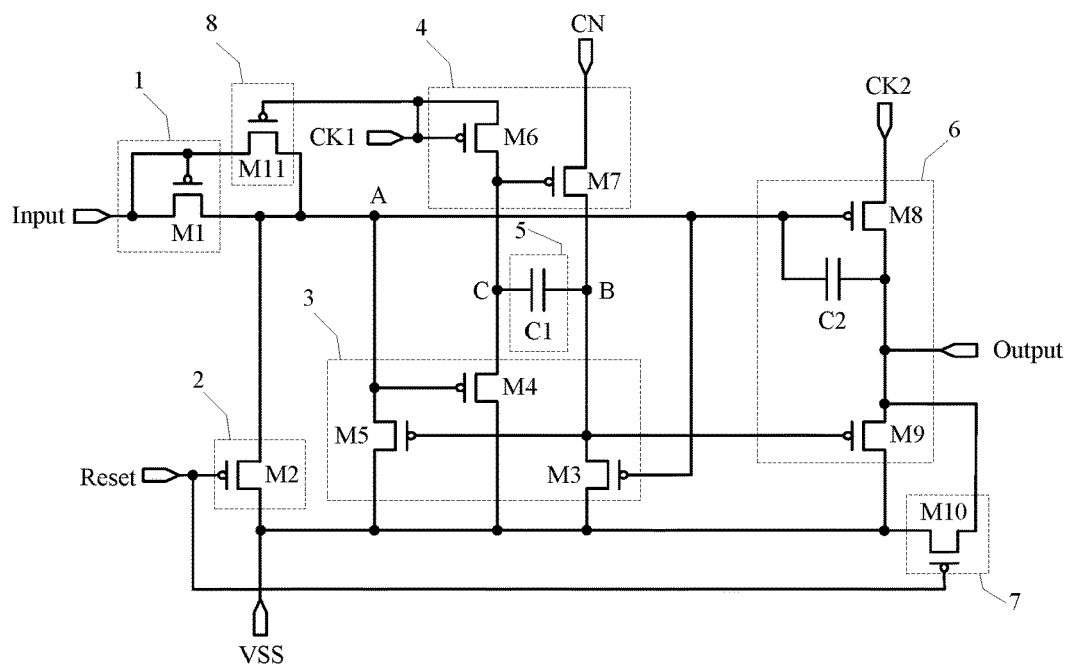
FIG. 4b is a second schematic diagram of specific structure of the shift register illustrated in FIG. 2.
Figure 5A:
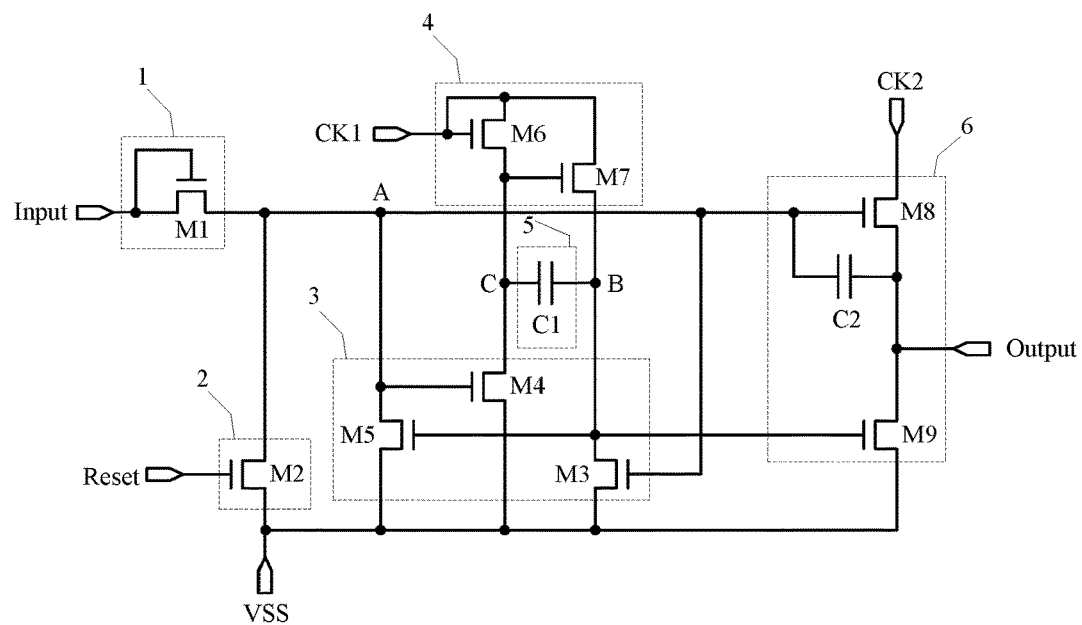
FIG. 5a is a third schematic diagram of specific structure of the shift register illustrated in FIG. 1.
Figure 5B:
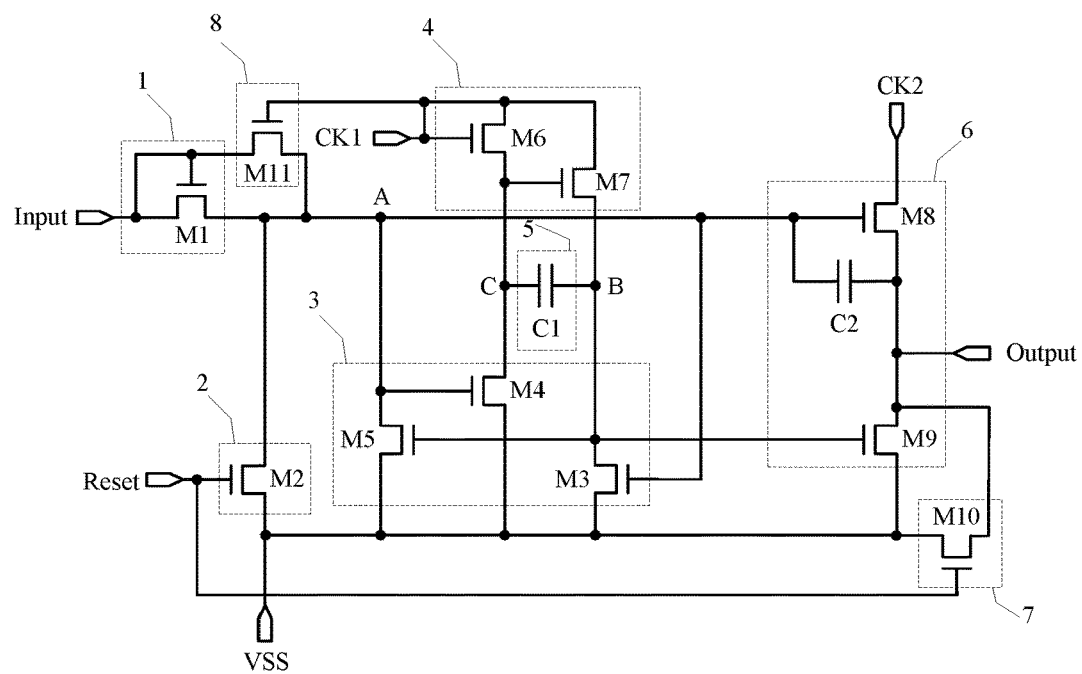
FIG. 5b is a third schematic diagram of the specific structure of the shift register illustrated in FIG. 2.
Figure 6A:
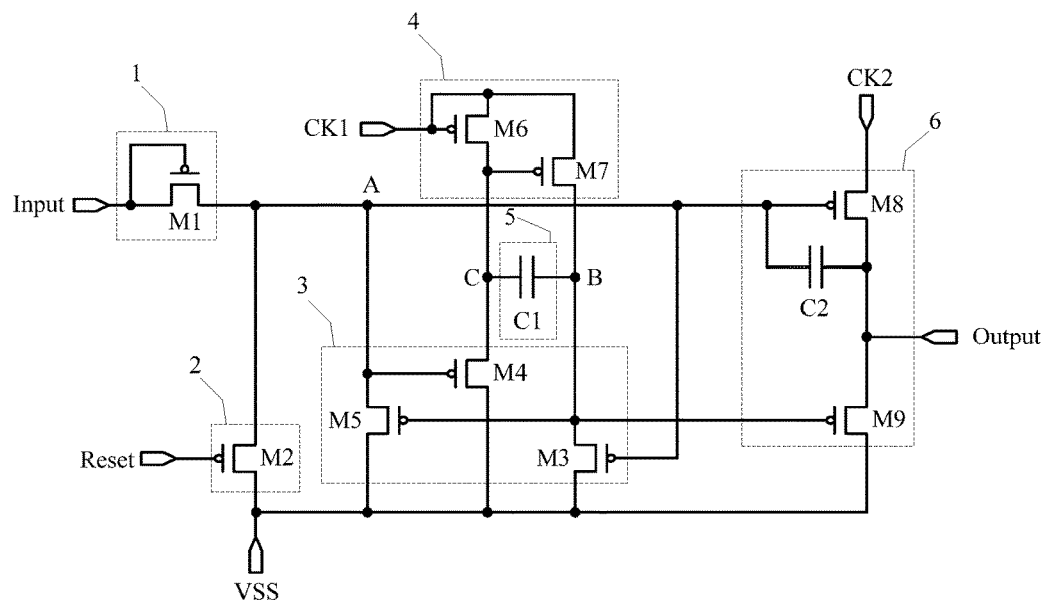
FIG. 6a is a fourth schematic diagram of specific structure of the shift register illustrated in FIG. 1.
Figure 6B:
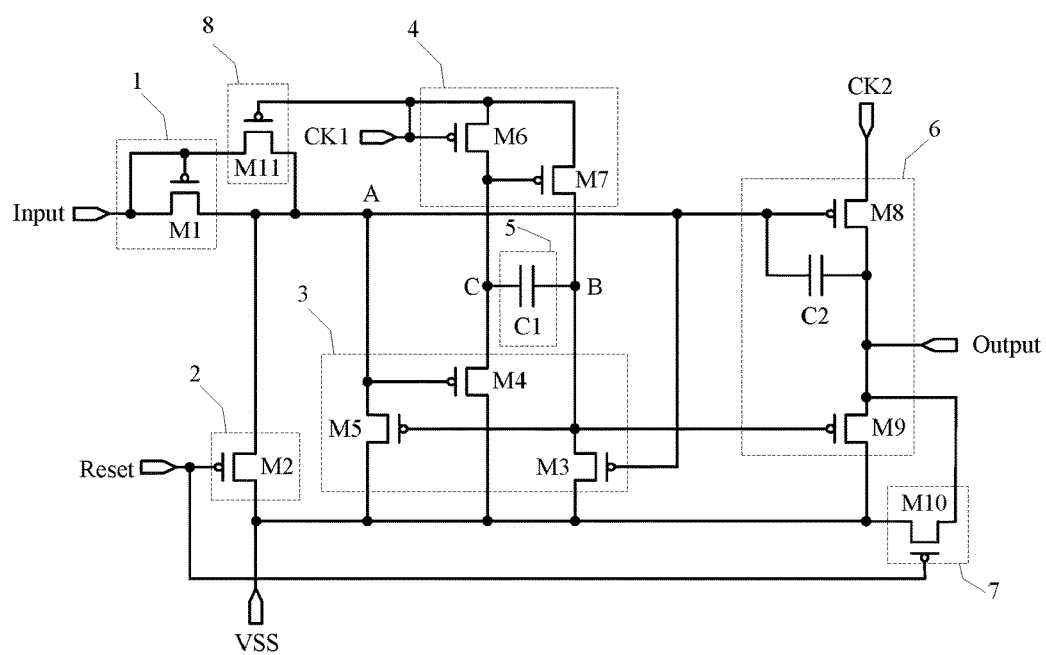
FIG. 6b is a fourth schematic diagram of the specific structure of the shift register illustrated in FIG. 2.

In a specific implementation, in the shift register provided above according to an embodiment of the present disclosure, as illustrated in FIGS. 3b, 4b, 5b, and 6b, the tenth switching transistor M10 can be an N-type switching transistor or a P-type switching transistor, no limitations are made here. As illustrated in FIGS. 3b and 5b, in a case where the tenth switching transistor M10 is an N-type switching transistor, when the reset signal terminal Reset is at a high potential, the tenth switching transistor M10 is in a turned-on state and a signal from the reference signal terminal is supplied to the driving signal output terminal Output; as illustrated in FIGS. 4b and 6b, in a case where the tenth switching transistor M10 is a P-type switching transistor, when the reset signal terminal Reset is at a low potential, the tenth switching transistor M10 is in a turned-on state and a signal from the reference signal terminal VSS is supplied to the driving signal output terminal Output.

The above merely illustrates specific structure of the second reset module in the shift register by examples, in a specific implementation, structure of the second reset module is not limited to the aforesaid structure provided by the embodiment of the present disclosure, it can be other structures known to those skilled in the art, no limitations are made here.

Further, in a specific implementation, in order to make the potential at the first node A be in a stable state, the shift register provided above according to an embodiment of the present disclosure, as illustrated in FIG. 2, can further comprise a node stabilization module 8;

a first terminal of the node stabilization module 8 is connected with the input signal terminal Input, a second terminal of the node stabilization module 8 is connected with the first clock signal terminal CK1, and a third terminal of the node stabilization module 8 is connected with the first node A; the node stabilization module 8 is configured to supply a signal from the input signal terminal Input to the first node A under control of the first clock signal terminal CK1.

Specifically, in a specific implementation, in the shift register provided above according to an embodiment of the present disclosure, as illustrated in FIGS. 3b, 4b, 5b, and 6b, the node stabilization module can specifically comprise an eleventh switching transistor M11; wherein a gate of the eleventh switching transistor M11 is connected with the first clock signal terminal CK1, a source of the eleventh switching transistor M11 is connected with the input signal terminal Input, and a drain of the eleventh switching transistor M11 is connected with the first node A.

In a specific implementation, in the shift register provided above according to an embodiment of the present disclosure, in a case in which an effective pulse signal from the input signal terminal Input is at a high potential, as illustrated in FIGS. 3b and 5b, the eleventh switching transistor M11 can be an N-type switching transistor; alternatively, in a case in which an effective pulse signal from the input signal terminal Input is at a low potential, as illustrated in FIGS. 4b and 6b, the eleventh switching transistor M11 can be a P-type switching transistor, no limitations are made here.

In a specific implementation, in the shift register provided above according to an embodiment of the present disclosure, when the eleventh switching transistor is in a turned-on state under control of the first clock signal terminal, a signal from the input signal terminal is supplied to the first node.

The above merely illustrates specific structure of the node stabilization module in the shift register by examples, in a specific implementation, structure of the node stabilization module is not limited to the aforesaid structure provided by the embodiment of the present disclosure, it can be other structures known to those skilled in the art, no limitations are made here.

Optionally, in order to reduce manufacturing process, in a specific implementation, in the shift register provided above according to an embodiment of the present disclosure, as illustrated in FIGS. 3a, 3b, 5a, and 5b, each of the switching transistors can be an N-type switching transistor; alternatively, as illustrated in FIGS. 4a, 4b, 6a, and 6b, each of the switching transistors can be a P-type switching transistor, no limitations are made here.

Further, in a specific implementation, in the shift register provided above according to an embodiment of the present disclosure, the N-type switching transistor is turned on under an effect of a high potential and turned off under an effect of a low potential; the P-type switching transistor is turned off under an effect of a high potential and turned on under an effect of a low potential.

It should be noted that each of the switching transistors mentioned in the above embodiments of the present disclosure can be a Thin Film Transistor, or a Metal Oxide Semiconductor (MOS) transistor, no limitations are made here. In a specific implementation, according to types of the transistors and different input signals, the functions of the source and the drain of each of these transistors can be interchanged, no differentiation is made here.

Hereinafter, operation process of the shift register provided by the embodiments of the present disclosure will be described in combination with circuit timing diagrams. In the following description, 1 represents a high potential signal, 0 represents a low potential signal, wherein 0 and 1 represent a logical potential thereof; it is only intended to better explain the operation process of the shift register provided according to an embodiment of the present disclosure, rather than to indicate a potential applied to gates of the respective switching transistors in a specific implementation. The following description is provided taking the case in which the control signal terminal and the first clock signal terminal are connected to a same signal terminal as an example.

First Embodiment

Figure 7A:
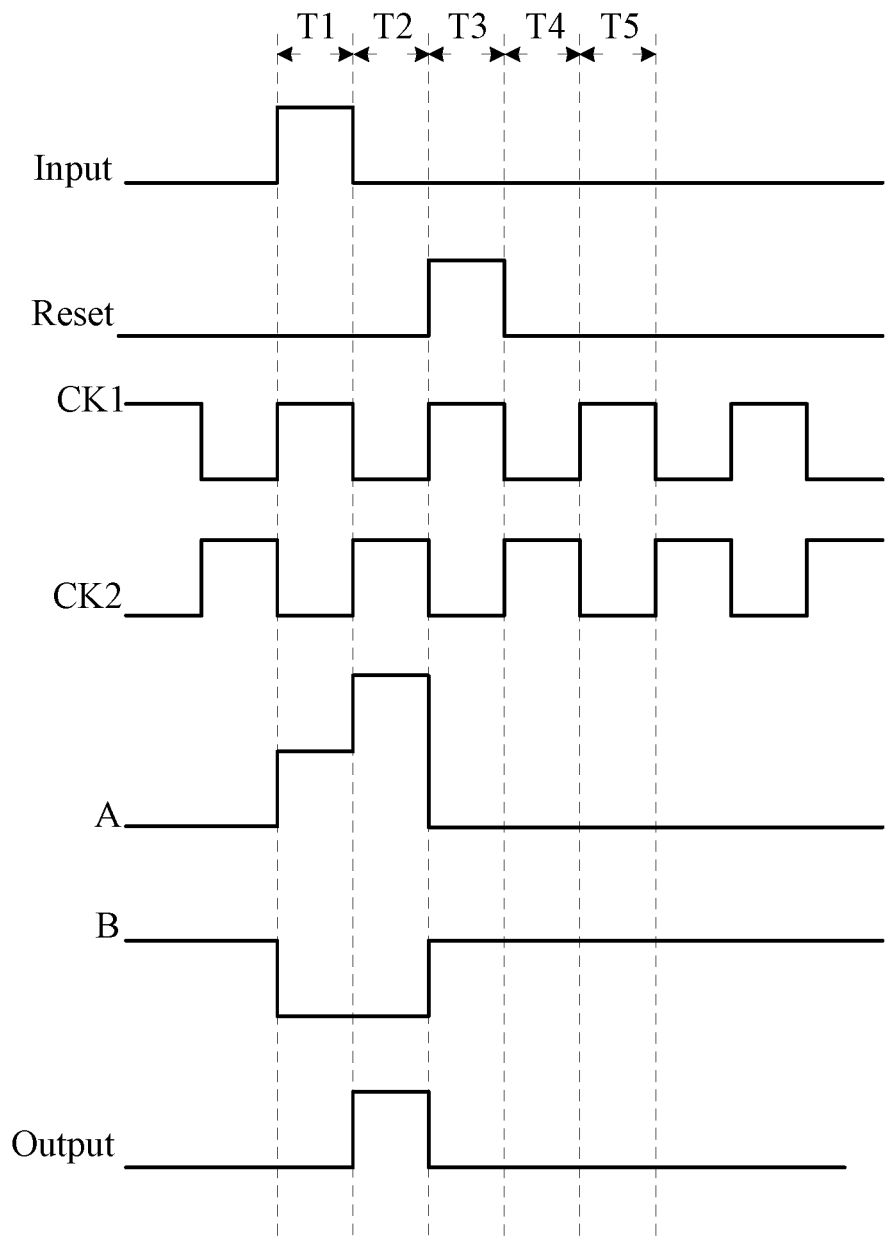
FIG. 7a is a circuit timing diagram of the shift register illustrated in FIG. 5b.

Operation process of the shift register will be described with structure of the shift register illustrated in FIG. 5b as an example. In the shift register illustrated in FIG. 5b, each of the switching transistors is an N-type switching transistor, and each N-type switching transistor is turned on under effect of a high potential and turned off under effect of a low potential; the potential at the reference signal terminal VSS is a low potential; the corresponding input/output timing diagram is illustrated in FIG. 7a; specifically, fives periods of a first period T1, a second period T2, a third period T3, a fourth period T4, and a fifth period T5 in the input/output timing diagram as illustrated in FIG. 7a are selected.

In the first period T1, Input=1, Reset=0, CK1=1, CK2=0.

Since Reset =0, the second switching transistor M2 and the tenth switching transistor M10 are both turned off. Since Input =1, the first switching transistor M1 is turned on; since the first switching transistor M1 is turned on and a signal with a high potential from the input signal terminal Input is supplied to the first node A, the potential at the first node A is a high potential, and the second capacitor C2 is charged. Since CK1 =1, the eleventh switching transistor M11 is turned on; since the eleventh switching transistor M11 is turned on and a signal with a high potential from the input signal terminal Input is supplied to the first node A, the first node A is further maintained in a stable state of a high potential; since the first node A is at a high potential, the third switching transistor M3, the fourth switching transistor M4, and the eighth switching transistor M8 are all turned on; since the fourth switching transistor M4 is turned on and a signal with a low potential from the reference signal terminal VSS is supplied to the third node C, the potential at the third node C is a low potential; since the potential at the third node C is a low potential, the seventh switching transistor M7 is turned off; since the third switching transistor is turned on and a signal with a low potential from the reference signal terminal VSS is supplied to the second node B, the potential at the node B is a low potential; since the potential at the second node B is a low potential, the fifth switching transistor M5 and the ninth switching transistor M9 are both turned off; since the eighth switching transistor M8 is turned on and a signal with a low potential from the second clock signal terminal CK2 is supplied to the driving signal output terminal Output, the driving signal output terminal Output outputs a signal with a low potential.

In the second period T2, Input=0, Reset=0, CK1=0, CK2=1.

Since Input=0, the first switching transistor M1 is turned off. Since Reset=0, the second switching transistor M2 and the tenth switching transistor M10 are both turned off. Since CK1=0, the sixth switching transistor M6 and the eleventh switching transistor M11 are both turned off, the first node A is in a floating state; the eighth switching transistor M8 continues to be turned on and a signal with a high potential from the second clock signal terminal CK2 is supplied to the driving signal output terminal Output, so that the driving signal output terminal Output outputs a scan signal with a high potential; since the second capacitor C2 is connected between the first node A and the driving signal output terminal, due to a bootstrap effect of the second capacitor C2, in order to maintain stability of the voltage difference across two terminals of the second capacitor C2, the potential at the node A is further pulled up, the third switching transistor M3 and the fourth switching transistor M4 are fully turned on; since the fourth switching transistor M4 is fully turned on and a signal with a low potential from the reference signal terminal VSS is supplied to the third node C, the potential at the third node C is a low potential; since the potential at the third node C is a low potential, the seventh switching transistor M7 is turned off; since the third switching transistor M3 is fully turned on and a signal with a low potential from the reference signal terminal VSS is supplied to the second node B, the potential at the second node B is a low potential; since the potential at the second node B is a low potential, the fifth switching transistor M5 and the ninth switching transistor M9 are both turned off.

In a third period T3, Input=0, Reset=1, CK1=1, CK2=0.

Since Input=0, the first switching transistor M1 is turned off. Since Reset=1, the second switching transistor M2 and the tenth switching transistor M10 are both turned on; since the second switching transistor M2 is turned on and a signal with a low potential from the reference signal terminal VSS is supplied to the first node A, the potential at the first node A is a low potential. Since CK1=1, the sixth switching transistor M6 is turned on; since the sixth switching transistor M6 is turned on and a signal with a high potential from the first clock signal terminal CK1 is supplied to the third node C, the potential at the third node C is a high potential; since the potential at the third node C is a high potential, the seventh switching transistor M7 is turned on and a signal with a high potential from the first clock signal terminal CK1 is supplied to the second node B, so that the potential at the second node B is a high potential; it is assumed that a voltage of the second node B at the high potential is a first voltage at this moment, since the first capacitor C1, the sixth switching transistor M6 and the seventh switching transistor M7 can achieve the function of a bootstrap circuit, a voltage of the second node B at a high potential is equal to a sum of the first voltage and a voltage of the third node C at a high potential due to the effect of the first capacitor C1, so that in this case, the voltage of the second node at a high potential is equal to the voltage of the effective pulse signal from the first clock signal terminal at a high potential, so as to ensure that the fifth transistor M5 and the ninth switching transistor M9 can be turned on fully and promptly; since the fifth switching transistor M5 is fully turned on and a signal with a low potential from the reference signal terminal VSS is supplied to the first node A, the potential at the first node A is further maintained at a low potential, which makes the third switching transistor M3 and the fourth switching transistor M4 be both fully turned off, in order to ensure that the third switching transistor M3 and the fourth switching transistor M4 do not affect a level value of the potential at the second node B and a level value of the potential at the third node C; since the ninth switching transistor M9 and the tenth switching transistor M10 are both turned on and a signal with a low potential from the reference signal terminal VSS is supplied to the driving signal output terminal Output, the driving signal output terminal Output outputs a signal with a low potential.

In the fourth period T4, Input=0, Reset=0, CK1=0, CK2=1.

Since Input=0, the first switching transistor M1 is turned off. Since Reset=0, the second switching transistor M2 and the tenth switching transistor M10 are both turned off. Since CK1=0, the sixth switching transistor M6 and the eleventh switching transistor M11 are both turned off, so that the potential at the second node B is maintained at a high level; since the potential at the second node B is a high potential, the fifth switching transistor M5 and the ninth switching transistor M9 are both turned on; since the fifth switching transistor M5 is turned on and a signal with a low potential from the reference signal terminal VSS is supplied to the first node A, the potential at the first node A is a low potential; since the potential at the first node A is a low potential, the third switching transistor M3, the fourth switching transistor M4, and the eighth switching transistor M8 are all turned off; since the ninth switching transistor M9 is turned on and a signal with a low potential signal from the reference signal terminal VSS is supplied to the driving signal output terminal Output, the driving signal output terminal Output outputs a signal with a low potential signal.

In the fifth period T5, Input=0, Reset=0, CK1=1, CK2=0.

Since Input=0, the first switching transistor M1 is turned off. Since Reset=0, the second switching transistor M2 and the tenth switching transistor M10 are both turned off. Since CK1=1, the sixth switching transistor M6 is turned on; since the switching transistor M6 is turned on and a signal with a high potential from the first clock signal terminal CK1 is supplied to the third node C, the potential at the third node C is a high potential; since the potential at the third node C is a high potential, the seventh switching transistor M7 is turned on; since the seventh switching transistor M7 is turned on and a signal with a high potential signal from the first clock signal terminal CK1 is supplied to the second node B, the potential at the second node B is a high potential; since the potential at the second node B is a high potential, the fifth switching transistor M5 and the ninth switching transistor M9 are both turned on; since the fifth switching transistor M5 is turned on and a signal with a low potential from the reference signal terminal VSS is supplied to the first node A, the potential at the first node A is a low potential; since the potential at the first node A is a low potential, the third switching transistor M3, the fourth switching transistor M4, and the eighth switching transistor M8 are all turned off; since the ninth switching transistor M9 is turned on and a signal with a low potential from the reference signal terminal VSS is supplied to the driving signal output terminal Output, the driving signal output terminal Output outputs a signal with a low potential.

In the shift register provided above according to an embodiment of the present disclosure, after the fifth period, the operation process of the fourth period and the fifth period is repeated until the next frame starts.

In the shift register provided above according to an embodiment of the present disclosure, since the first capacitor, the sixth switching transistor and the seventh switching transistor can form a bootstrap circuit after outputting the scan signal, a voltage at the second node can be increased promptly to a voltage equal to that of a signal from the first clock signal clock terminal, so that it is possible to enhance the reliability of the shift register by lowering a level value of the high potential at the first clock signal terminal; thereby in a case in which the shift register is applied to a display device, lifespan and reliability of the display device can be improved.

Second Embodiment

Figure 7B:
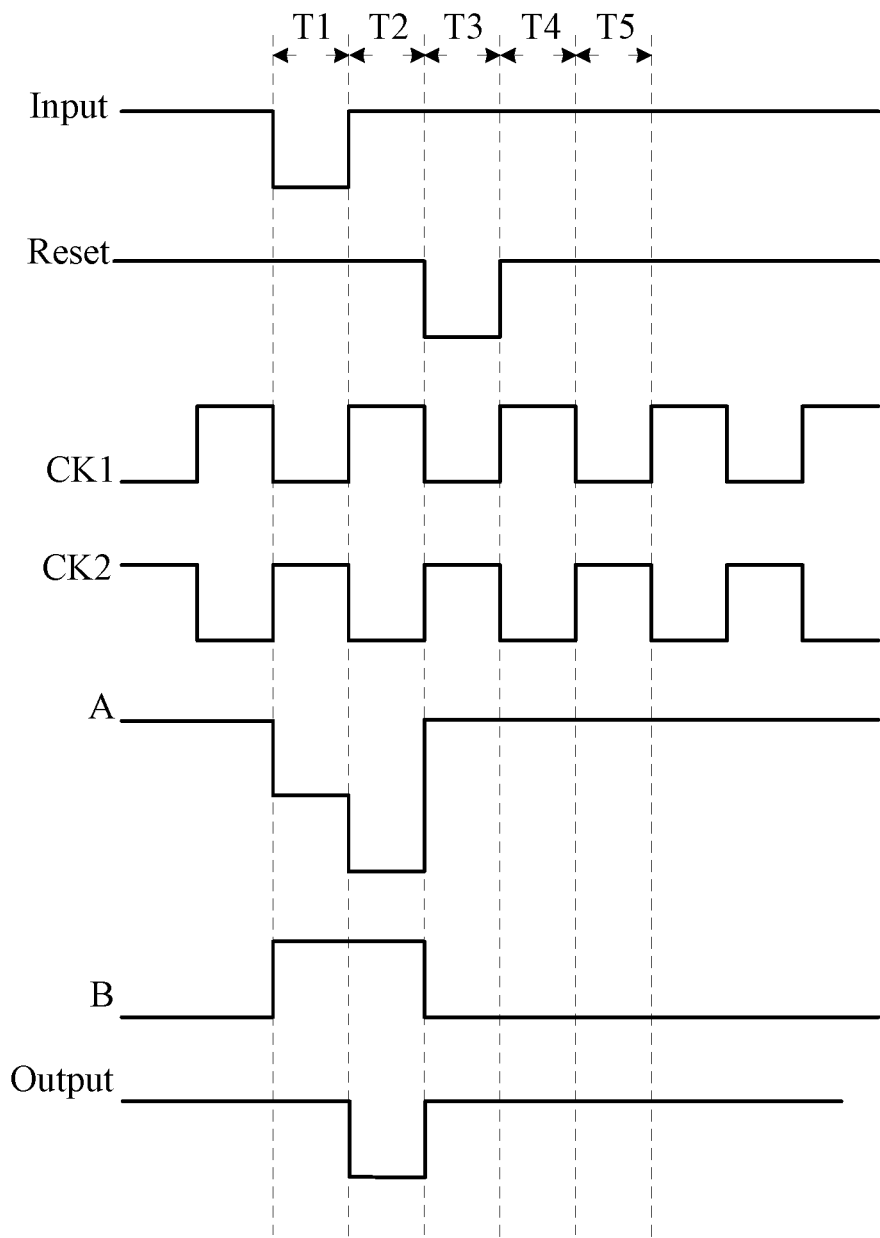
FIG. 7b is a circuit timing diagram of the shift register illustrated in FIG. 6b.

Operation process of the shift register will be described with structure of the shift register illustrated in FIG. 6b as an example. In the shift register illustrated in FIG. 6b, each of the switching transistors is a P-type switching transistor, each P-type switching transistor is turned on under effect of a low potential and turned off under effect of a high potential; the potential at the reference signal terminal VSS is a high potential, a corresponding input/output timing diagram is as illustrated in FIG. 7b, specifically, fives periods of a first period T1, a second period T2, a third period T3, a fourth period T4, and a fifth period T5 in the input/output timing diagram as illustrated in FIG. 7b are selected.

In the first period T1, Input=0, Reset=1, CK1=0, CK2=1.

Since Reset =1, the second switching transistor M2 and the tenth switching transistor M10 are both turned off. Since Input =0, the first switching transistor M1 is turned on; since the first switching transistor M1 is turned on and a signal with a low potential from the input signal terminal Input is supplied to the first node A, the potential at the first node A is a low potential, and the second capacitor C2 starts to be discharged. Since CK1 =0, the eleventh switching transistor M11 is turned on; since the eleventh switching transistor M11 is turned on and a signal with a low potential from the input signal terminal Input is supplied to the first node A, the first node A is further maintained in a stable state of a low potential; since the first node A is at a low potential, the third switching transistor M3, the fourth switching transistor M4, and the eighth switching transistor M8 are all turned on; since the fourth switching transistor M4 is turned on and a signal with a high potential from the reference signal terminal VSS is supplied to the third node C, the potential at the third node C is a high potential; since the potential at the third node C is a high potential, the seventh switching transistor M7 is turned off; since the third switching transistor M3 is turned on and a signal with a high potential from the reference signal terminal VSS is supplied to the second node B, the potential at the second node B is a high potential; since the potential at the second node B is a high potential, the fifth switching transistor M5 and the ninth switching transistor M9 are both turned off; since the eighth switching transistor M8 is turned on and a signal with a high potential from the second clock signal terminal CK2 is supplied to the driving signal output terminal Output, the driving signal output terminal Output outputs a signal with a high potential.

In the second period T2, Input=1, Reset=1, CK1=1, CK2=0.

Since Input=1, the first switching transistor M1 is turned off. Since Reset=1, the second switching transistor M2 and the tenth switching transistor M10 are both turned off. Since CK1=1, the sixth switching transistor M6 and the eleventh switching transistor M11 are both turned off, so that the first node A is in a floating state; the eighth switching transistor M8 continues to be turned on and a signal with a low potential from the second clock signal terminal CK2 is supplied to the driving signal output terminal Output, so that the driving signal output terminal Output outputs a scan signal with a low potential; since the second capacitor C2 is connected between the first node A and the driving signal output terminal Output, due to a bootstrap function of the second capacitor C2, in order to maintain stability of a voltage difference across two terminals of the second capacitor C2, the potential at the node A is further pulled down, thus the third switching transistor M3 and the fourth switching transistor M4 are fully turned on; since the fourth switching transistor M4 is fully turned on and a signal with a high potential from the reference signal terminal VSS is supplied to the third node C, the potential at the third node C is a high potential; since the potential at the third node C is a high potential, the seventh switching transistor M7 is turned off; since the third switching transistor M3 is fully turned on and a signal with a high potential from the reference signal terminal VSS is supplied to the second node B, the potential at the second node B is a high potential; since the potential at the second node B is a high potential, the fifth switching transistor M5 and the ninth switching transistor M9 are both turned off.

In the third period T3, Input=1, Reset=0, CK1=0, CK2=1.

Since Input=1, the first switching transistor M1 is turned off. Since Reset=0, the second switching transistor M2 and the tenth switching transistor M10 are both turned on; since the second switching transistor M2 is turned on and a signal with a high potential from the reference signal terminal VSS is supplied to the first node A, the potential at the first node A is a high potential. Since CK1=0, the sixth switching transistor M6 is turned on; since the sixth switching transistor M6 is turned on and a signal with a low potential from the first clock signal terminal CK1 is supplied to the third node C, the potential at the third node C is a low potential; since the potential at the third node C is a low potential, the seventh switching transistor M7 is turned on and a signal with a low potential from the first clock signal terminal CK1 is supplied to the second node B, the potential at the second node B is a low potential; it is assumed that a voltage of the second node B at a low potential is a first voltage at this moment, since the first capacitor C1, the sixth switching transistor M6 and the seventh switching transistor M7 can achieve the function of a bootstrap circuit, a voltage of the second node B at a low potential is equal to a sum of the first voltage and a voltage of the third node C at a low potential due to the effect of the capacitor C1, so that a voltage of the second node B at a low potential is equal to a voltage of the effective pulse signal from the first clock signal terminal CK1 at a low potential, thus ensuring that the fifth switching transistor M5 and the ninth switching transistor M9 can be turned on fully and promptly; since the fifth switching transistor M5 is fully turned on and a signal with a high potential from the reference signal terminal VSS is supplied to the first node A, the potential at the first node A is further maintained at a high potential, so that the third switching transistor M3 and the fourth switching transistor M4 are fully turned off, ensuring that the third switching transistors M3 and the fourth switching transistor M4 do not affect level values of the potentials at the second node B and the third node C; since the ninth switching transistor M9 and the tenth switching transistor M10 are both turned on and a signal with a high potential signal from the reference signal terminal VSS is supplied to the driving signal output terminal Output, the driving signal output terminal Output outputs a signal with a high potential.

In the fourth period T4, Input=1, Reset=1, CK1=1, CK2=0.

Since Input=1, the first switching transistor M1 is turned off. Since Reset=1, the second switching transistor M2 and the tenth switching transistor M10 are both turned off. Since CK1=1, the sixth switching transistor M6 and the eleventh switching transistor M11 are both turned off, so that the potential at the second node B is maintained at a low potential; since the potential at the second node B is a low potential, the fifth switching transistor M5 and the ninth switching transistor M9 are both turned on; since the fifth switching transistor M5 is turned on and a signal with a high potential is supplied to the first node A, the potential at the node A is a high potential; since the potential of the first node A is a high potential, the third switching transistor M3, the fourth switching transistor M4, and the eighth switching transistor M8 are all turned off; since the ninth switching transistor M9 is turned on and a signal with a high potential from the reference signal terminal VSS is supplied to the driving signal output terminal Output, the driving signal output terminal Output outputs a signal with a high potential.

In the fifth period T5, Input=1, Reset=1, CK1=0, CK2=1.

Since Input=1, the first switching transistor M1 is turned off. Since reset=1, the second switching transistor M2 and the tenth switching transistor M10 are both turned off. Since CK1=0, the sixth switching transistor M6 is turned on and a signal with a low potential from the first clock signal CK1 is supplied to the third node C, and thus the potential at the third node C is a low potential; since the potential at the third node C is a low potential, the seventh switching transistor M7 is turned on; since the seventh switching transistor M7 is turned on and a signal with a low potential from the first clock signal terminal CK1 is supplied to the second node B, a potential at the second node B is a low potential; since the potential at the second node B is a low potential, the fifth switching transistor M5 and the ninth switching transistor M9 are both turned on; since the fifth switching transistor M5 is turned on and a signal with a high potential from the reference signal terminal VSS is supplied to the first node A, the potential at the first node A is a high potential; since the potential at the first node A is a high potential, the third switching transistor M3, the fourth switching transistor M4, and the eighth switching transistor M8 are all turned off; since the ninth switching transistor M9 is turned on and a signal with a high potential from the reference signal terminal VSS is supplied to the driving signal output terminal Output, the driving signal output terminal Output outputs a signal with a high potential.

In the shift register provided above according to an embodiment of the present disclosure, after the fifth period, the operation process of the fourth period and the fifth period is repeated until the next frame starts.

In the shift register provided above according to an embodiment of the present disclosure, since the first capacitor, the sixth switching transistor and the seventh switching transistor can form a bootstrap circuit after outputting the scan signal, a voltage at the second node can be decreased promptly to be equal to that of a signal from the first clock signal terminal, it is possible to improve reliability of the shift register by increasing a level value of a low potential at the first clock signal terminal, in a case in which the shift register is applied to a display device, lifespan and reliability of the display device can be improved.

Based on the same inventive concept, an embodiment of the present application provides a gate driving circuit, as illustrated in FIG. 7, the gate driving circuit comprises a plurality of stages of the shift registers SR(1), SR(2) . . .

SR(n) ... SR(N-1), SR(N) (N shift registers in total, 1≤n≤N) in cascade as provided according to an embodiment of the present disclosure, wherein an input signal terminal Input of the shift register SR(1) in a first stage is connected with a frame trigger signal terminal STV; other than the shift register SR(1) in the first stage, an input signal terminal Input of the shift register SR(n) in each of stages is connected with a driving signal output terminal Output_n−1 of the shift register in a previous stage, respectively; other than the shift register SR(N) in the last stage, a reset signal terminal Reset of the shift register SR(n) in each of stages is connected with a driving signal output terminal Output_n+1 of the shift register SR(n+1) in a next stage, respectively.

Specifically, structure and function of each of the shift registers in the gate driving circuit described above are the same as those of the shift register provided above by the present disclosure, no more details are repeated here.

In a specific implementation, in the gate driving circuit provided above according to an embodiment of the present disclosure, the shift register in each stage comprises an input signal terminal, a reset signal terminal, a control signal terminal, a first clock signal terminal, a second clock signal terminal, a reference signal terminal, and a driving signal outputting terminal. Optionally, in a specific implementation, in order to reduce the number of signal lines, in the shift register of each stage, the control signal terminal and the first clock signal terminal CK1 can be connected to a same signal terminal. The signal input manner of the gate driving circuit will be explained below by taking the case in which the control signal terminal and the first clock signal terminal in the shift register of each stage are connected to a same signal terminal as an example.

Figure 8:
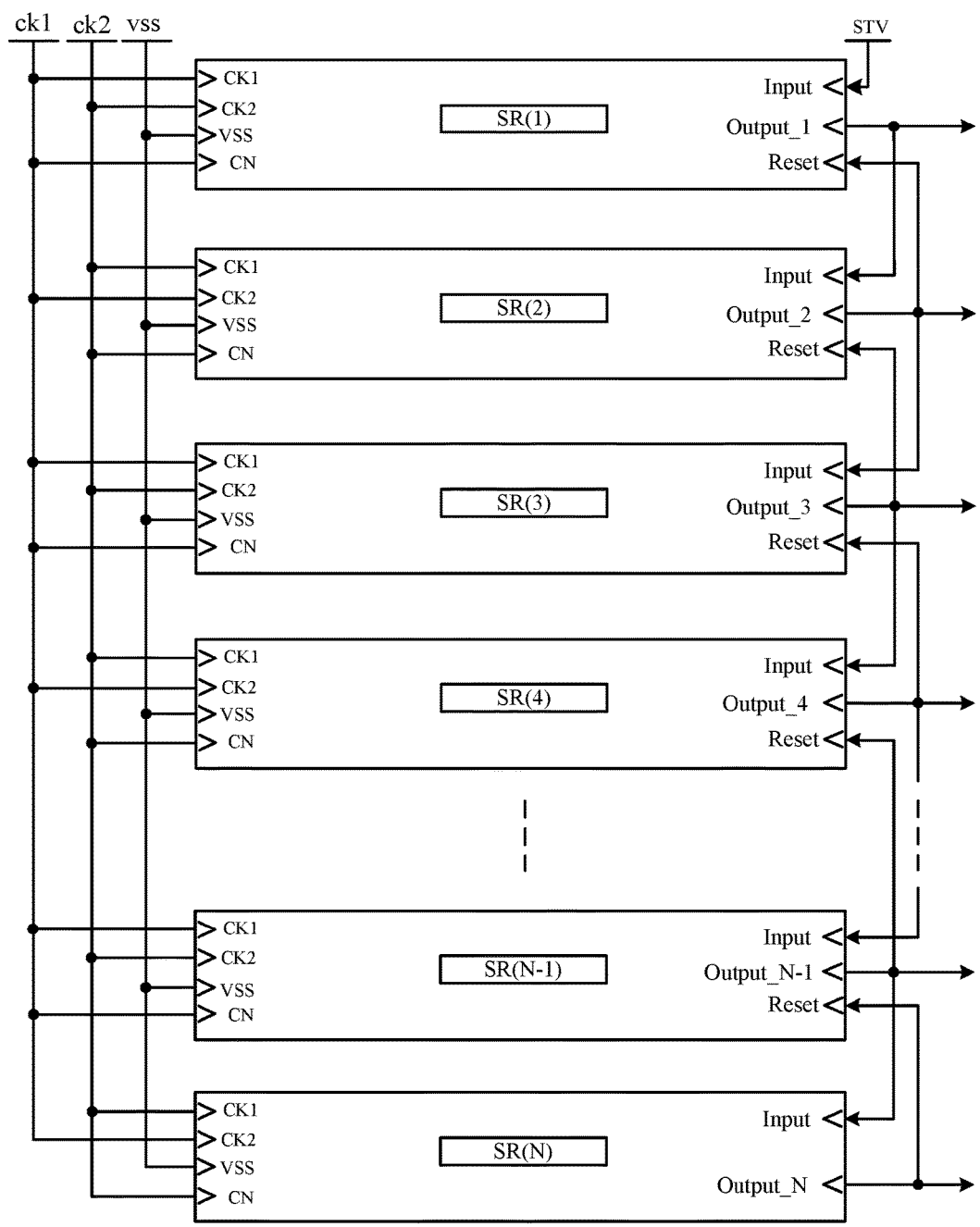
FIG. 8 is a schematic diagram of structure of the gate driving circuit provided according to an embodiment of the present disclosure.

In a specific implementation, in the gate driving circuit provided above according to an embodiment of the present disclosure, as illustrated in FIG. 8, the control signal terminal CN and the first clock signal terminal CK1 of the shift register in the (2k-1)-th stage, and the second clock signal terminal CK2 of shift register in the 2k-th stage are all connected to one clock, i.e., a first clock ck 1; the second clock signal terminal CK2 of the shift register in the (2k-1)-th stage, the control signal terminal CN and the first clock signal terminal CK1 of the shift register in the 2k-th stage, and are all connected to another clock, i.e., a second clock ck2, wherein k is a positive integer greater than zero.

Based on the same inventive concept, an embodiment of the present disclosure provides a display device, comprising the gate driving circuit provided above by the present disclosure, wherein the driving signal output terminals of the shift registers in respective stages in the gate driving circuit provide respective gate lines on an array substrate on the display device with scanning signals; for the specific implementations, reference can be made to descriptions provided above for the shift register, no more details are repeated here. The display device can be any product or component having a display function such as mobile phone, tablet computer, television set, monitor, notebook computer, digital photo frame, navigator, and so on. Other essential components of the display device will be understood by those of ordinary skill in the art, no more details are repeated here for them, which should not be construed as limiting the present disclosure.

The shift register, the gate driving circuit, and the display device provided by the embodiment of the present disclosure, comprise an input module, a first reset module, a first control module, a second control module, a node voltage control module, and an output module, wherein the input module is configured to supply a signal from the input signal terminal to the first node under control of the input signal terminal; the first reset module is configured to supply a signal from the reference signal terminal to the first node under control of the reset signal terminal; the first control module is configured to supply a signal from the reference signal terminal to the second node and the third node respectively under control of the first node, and supply a signal from the reference signal terminal to the first node under control of the second node; the second control module is configured to supply a signal from the first clock signal terminal to the third node under control of the first clock signal terminal, and supply a signal from the control signal terminal to the second node under control of the third node; the node voltage control module is configured to form a bootstrap circuit together with the second control module, so as to make a voltage at the second node equal to a voltage of an effective pulse signal at the first clock signal terminal under control of the third node; the output module is configured to supply a signal from the second clock signal terminal to the driving signal output terminal under control of the first node, supply a signal from the reference signal terminal to the driving signal output terminal under control of the second node, and maintain stability of a voltage difference between the first node and the driving signal output terminal when the first node is in a floating state. In the shift register, with the cooperation of the aforesaid six modules and the bootstrap circuit formed by utilizing the node voltage control module and the second control module, the voltage at the second node can be equal to a voltage of the effective pulse signal at the first clock signal terminal, so that the first control module can operate promptly and effectively under control of the second node, a signal having a potential opposite to that of an effective pulse signal from the input signal terminal can be outputted promptly after the driving signal output terminal of the shift register completes its outputting, so as to improve output stability of the shift register, thereby reducing the noise in the scan signal outputted from the driving signal output terminal, and better stabilizing outputting of the scan signal.

Apparently, a person skill in the art can make various modifications and variations to the present disclosure without departing from the spirit and scope thereof. The present disclosure is also intended to include these modifications and variations if these modification and variations fall into the scope of the claims of the present application and the equivalent techniques thereof.

The present disclosure claims the priority of Chinese Patent Application No. 201610034449.9 filed on Jan. 19, 2016, the entire content of which is hereby incorporated in full text by reference as part of the present disclosure.

What is claimed is:
1. A shift register, comprising an input module, a first reset module, a first control module, a second control module, a node voltage control module, and an output module, wherein
a first terminal of the input module is connected with an input signal terminal, and a second terminal of the input module is connected with a first node; the input module is configured to supply a signal from the input signal terminal to the first node under control of the input signal terminal;
a first terminal of the first reset module is connected with a reset signal terminal, a second terminal of the first reset module is connected with a reference signal terminal, and a third terminal of the first reset module is connected with the first node; the first reset module is configured to supply a signal from the reference signal terminal to the first node under control of the reset signal terminal;

a first terminal of the first control module is connected with the first node, a second terminal of the first control module is connected with a second node, a third terminal of the first control module is connected with a third node, and a fourth terminal of the first control module is connected with the reference signal terminal; the first control module is configured to supply the signal from the reference signal terminal to the second node and the third node under control of the first node, and supply the signal from the reference signal terminal to the first node under control of the second node;

a first terminal of the second control module is connected with a first clock signal terminal, a second terminal of the second control module is connected with a control signal terminal, a third terminal of the second control module is connected with the second node, and a fourth terminal of the second control module is connected with the third node; the second control module is configured to supply a signal from the first clock signal terminal to the third node under control of the first clock signal terminal, and supply a signal from the control signal terminal to the second node under control of the third node;

a first terminal of the node voltage control module is connected with the second node, and a second terminal of the node voltage control module is connected with the third node; the node voltage control module is configured to form a bootstrap circuit together with the second control module, so as to make a voltage at the second node equal to a voltage of an effective pulse signal at the first clock signal terminal under control of the third node; and a first terminal of the output module is connected with a second clock signal terminal, a second terminal of the output module is connected with the reference signal terminal, a third terminal of the output module is connected with the first node, a fourth terminal of the output module is connected with the second node, and a fifth terminal of the output module is connected with a driving signal output terminal of the shift register; the output module is configured to supply a signal from the second clock signal terminal to the driving signal output terminal under control of the first node, supply the signal from the reference signal terminal to the driving signal output terminal under control of the second node, and maintain stability of a voltage difference between the first node and the driving signal output terminal when the first node is in a floating state.

2. The shift register according to claim 1, wherein the node voltage control module comprises a first capacitor;
one terminal of the first capacitor is connected with the second node, and the other terminal of the first capacitor is connected with the third node.

3. The shift register according to claim 1, wherein the input module comprises a first switching transistor;
a gate and a source of the first switching transistor are both connected with the input signal terminal, and a drain of the first switching transistor is connected with the first node.

4. The shift register according to claim 1, wherein the first reset module comprises a second switching transistor;
a gate of the second switching transistor is connected with the reset signal terminal, a source of the second switching transistor is connected with the reference signal terminal, and a drain of the second switching transistor is connected with the first node.

5. The shift register according to claim 1, wherein the first control module comprises a third switching transistor, a fourth switching transistor, and a fifth switching transistor;
a gate of the third switching transistor is connected with the first node, a source of the third switching transistor is connected with the reference signal terminal, and a drain of the third switching transistor is connected with the second node;
a gate of the fourth switching transistor is connected with the first node, a source of the fourth switching transistor is connected with the reference signal terminal, and a drain of the fourth switching transistor is connected with the third node;
a gate of the fifth switching transistor is connected with the second node, a source of the fifth switching transistor is connected with the reference signal terminal, and a drain of the fifth switching transistor is connected with the first node.

6. The shift register according to claim 1, wherein the second control module comprises a sixth switching transistor and a seventh switching transistor;
a gate and a source of the sixth switching transistor are both connected with the first clock signal terminal, and a drain of the sixth switching transistor is connected with the third node; and
a gate of the seventh switching transistor is connected with the third node, a source of the seventh switching transistor is connected with the control signal terminal, and a drain of the seventh switching transistor is connected with the second node.

7. The shift register according to claim 1, wherein the output module comprises an eighth switching transistor, a ninth switching transistor, and a second capacitor;
a gate of the eighth switching transistor is connected with the first node, a source of the eighth switching transistor is connected with the second clock signal terminal, and a drain of the eighth switching transistor is connected with the driving signal output terminal;
a gate of the ninth switching transistor is connected with the second node, a source of the ninth switching transistor is connected with the reference signal terminal, and a drain of the ninth switching transistor is connected with the driving signal output terminal; and
one terminal of the second capacitor is connected with the first node, and the other terminal of the second capacitor is connected with the driving signal output terminal.

8. The shift register according to claim 1, further comprising a second reset module, wherein
a first terminal of the second reset module is connected with the reset signal terminal, a second terminal of the second reset module is connected with the reference signal terminal, and a third terminal of the second reset module is connected with the driving signal output terminal; the second reset module is configured to supply the signal from the reference signal terminal to the driving signal output terminal under control of the reset signal terminal.

9. The shift register according to claim 8, wherein the second reset module comprises a tenth switching transistor;
a gate of the tenth switching transistor is connected with the reset signal terminal, a source of the tenth switching transistor is connected with the reference signal terminal, and a drain of the tenth switching transistor is connected with the driving signal output terminal.

10. The shift register according to claim 1, further comprising a node stabilization module, wherein
a first terminal of the node stabilization module is connected with the input signal terminal, a second terminal of the node stabilization module is connected with the first clock signal terminal, and a third terminal of the node stabilization module is connected with the first node; the node stabilization module is configured to supply the signal from the input signal terminal to the first node under control of the first clock signal terminal.

11. The shift register according to claim 10, wherein the node stabilization module comprises an eleventh switching transistor;
a gate of the eleventh switching transistor is connected with the first clock signal terminal, a source of the eleventh switching transistor is connected with the input signal terminal, and a drain of the eleventh switching transistor is connected with the first node.

12. The shift register according to claim 1, wherein a potential at the control signal terminal is opposite to a potential at the reference signal terminal.

13. A gate driving circuit, comprising a plurality of cascaded stages of the shift register according to claim 1, wherein
the input signal terminal of the shift register in the first stage of the plurality of cascaded stages is connected with a frame trigger signal terminal;
except the shift register in the first stage of the plurality of cascaded stages, the input signal terminal of the shift register in each of the plurality of cascaded stages is connected with the driving signal output terminal of the shift register in a previous stage of the plurality of cascaded stages;
except the shift register in the last stage of the plurality of cascaded stages, the reset signal terminal of the shift register in each of the plurality of cascaded stages is connected with the driving signal output terminal of the shift register in a next stage of the plurality of cascaded stages.

14. A display device, comprising the gate driving circuit according to claim 13.

15. The shift register according to claim 1, wherein the control signal terminal and the first clock signal terminal are connected to a same signal terminal.

16. The gate driving circuit according to claim 13, wherein the node voltage control module comprises a first capacitor;
one terminal of the first capacitor is connected with the second node, and the other terminal of the first capacitor is connected with the third node.

17. The gate driving circuit according to claim 13, wherein the input module comprises a first switching transistor;
a gate and a source of the first switching transistor are both connected with the input signal terminal, and a drain of the first switching transistor is connected with the first node.

18. The gate driving circuit according to claim 13, wherein the first reset module comprises a second switching transistor;
a gate of the second switching transistor is connected with the reset signal terminal, a source of the second switching transistor is connected with the reference signal terminal, and a drain of the second switching transistor is connected with the first node.

19. The gate driving circuit according to claim 13, wherein the first control module comprises a third switching transistor, a fourth switching transistor, and a fifth switching transistor;
a gate of the third switching transistor is connected with the first node, a source of the third switching transistor is connected with the reference signal terminal, and a drain of the third switching transistor is connected with the second node;
a gate of the fourth switching transistor is connected with the first node, a source of the fourth switching transistor is connected with the reference signal terminal, and a drain of the fourth switching transistor is connected with the third node;
a gate of the fifth switching transistor is connected with the second node, a source of the fifth switching transistor is connected with the reference signal terminal, and a drain of the fifth switching transistor is connected with the first node.

20. The gate driving circuit according to claim 13, wherein the second control module comprises a sixth switching transistor and a seventh switching transistor;
a gate and a source of the sixth switching transistor are both connected with the first clock signal terminal, and a drain of the sixth switching transistor is connected with the third node; and
a gate of the seventh switching transistor is connected with the third node, a source of the seventh switching transistor is connected with the control signal terminal, and a drain of the seventh switching transistor is connected with the second node.

* * * * *